(12) United States Patent
Drummond et al.

(10) Patent No.: US 11,152,226 B2
(45) Date of Patent: Oct. 19, 2021

(54) STRUCTURE WITH CONTROLLED CAPILLARY COVERAGE

(71) Applicant: International Business Machines Corporation, Armonk, NY (US)

(72) Inventors: Kevin Drummond, Wappingers Falls, NY (US); Thomas Lombardi, Poughkeepsie, NY (US); Steve Ostrander, Poughkeepsie, NY (US); Stephanie Allard, St-Hyacinthe (CA); Catherine Dufort, Bromont (CA)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 27 days.

(21) Appl. No.: 16/601,799

(22) Filed: Oct. 15, 2019

(65) Prior Publication Data
US 2021/0111039 A1     Apr. 15, 2021

(51) Int. Cl.
*H01L 21/56* (2006.01)
*H01L 23/00* (2006.01)
(Continued)

(52) U.S. Cl.
CPC ............ *H01L 21/563* (2013.01); *H01L 24/05* (2013.01); *H01L 24/29* (2013.01); *H01L 24/31* (2013.01);
(Continued)

(58) Field of Classification Search
None
See application file for complete search history.

(56) References Cited

U.S. PATENT DOCUMENTS

| 4,724,473 A | 2/1988 | Lacruche |
| 5,766,982 A * | 6/1998 | Akram ................... H01L 24/32 |
| | | 438/51 |

(Continued)

FOREIGN PATENT DOCUMENTS

| CN | 102098020 B | 5/2014 |
| DE | 19729073 A1 | 7/1997 |

(Continued)

OTHER PUBLICATIONS

Anonymous, "Method for UV-activated TiO2 wetting layers to enhance the capillary underfill process for electronic packages", IPCOM000133498D, Jan. 26, 2006, 6 pages.

(Continued)

*Primary Examiner* — Anthony Ho
*Assistant Examiner* — Kevin Quinto
(74) *Attorney, Agent, or Firm* — Cantor Colburn LLP; L. Jeffrey Kelly

(57) ABSTRACT

A structure with controlled capillary coverage is provided and includes a substrate including one or more first contacts, a component and adhesive. The component includes one or more second contacts and a rib disposed at a distance from each of the one or more second contacts. The component is disposed such that the one or more second contacts are communicative with the one or more first contacts and corresponding surfaces of the substrate and the rib face each other at a controlled gap height to define a fill-space. The adhesive is dispensed at a discrete point whereby the adhesive is drawn to fill the fill-space by capillary action.

24 Claims, 6 Drawing Sheets

(51) Int. Cl.
*H05K 3/32* (2006.01)
*H05K 1/11* (2006.01)

(52) U.S. Cl.
CPC ............... *H01L 24/83* (2013.01); *H05K 1/11* (2013.01); *H05K 3/321* (2013.01); *H01L 2224/05568* (2013.01); *H01L 2224/831* (2013.01); *H01L 2924/1531* (2013.01); *H01L 2924/1904* (2013.01); *H05K 2201/10303* (2013.01); *H05K 2201/10719* (2013.01); *H05K 2201/10734* (2013.01)

(56) References Cited

U.S. PATENT DOCUMENTS

| | | |
|---|---|---|
| 6,291,264 B1 | 9/2001 | Tang et al. |
| 6,365,441 B1 | 4/2002 | Raiser et al. |
| 6,614,122 B1 | 9/2003 | Dory et al. |
| 6,800,946 B2 | 10/2004 | Chason et al. |
| 6,821,878 B2 | 11/2004 | Danvir et al. |
| 7,038,321 B1 | 5/2006 | Chavan et al. |
| 7,359,211 B2 | 4/2008 | Landeros et al. |
| 7,432,602 B2 | 10/2008 | Kuramochi |
| 8,159,067 B2 | 4/2012 | Daubenspeck et al. |
| 8,294,279 B2 | 10/2012 | Chen et al. |
| 8,299,859 B2 | 10/2012 | Sato et al. |
| 8,451,620 B2 | 5/2013 | Yim et al. |
| 9,798,088 B2 | 10/2017 | Hong et al. |
| 9,837,292 B2 | 12/2017 | Chuang et al. |
| 10,325,783 B2 | 6/2019 | Munding |
| 2004/0121512 A1 | 6/2004 | Hsu et al. |
| 2005/0121310 A1 | 6/2005 | Yamanda et al. |
| 2006/0220195 A1 | 10/2006 | Sane |
| 2007/0099346 A1 | 5/2007 | Farooq et al. |
| 2007/0269930 A1 | 11/2007 | Gupta et al. |
| 2010/0038780 A1 | 2/2010 | Daubenspeck et al. |
| 2012/0217593 A1* | 8/2012 | Graf ..................... H01L 24/13 257/415 |
| 2012/0326193 A1* | 12/2012 | Park ..................... H01L 33/06 257/98 |
| 2015/0162258 A1 | 6/2015 | Hsu et al. |
| 2016/0254205 A1 | 9/2016 | Wang et al. |
| 2019/0221445 A1 | 7/2019 | Chiu et al. |

FOREIGN PATENT DOCUMENTS

| | | |
|---|---|---|
| DE | 10057606 B4 | 4/2004 |
| EP | 0322121 A1 | 6/1989 |
| FR | 2538166 | 12/1982 |
| JP | H10112581 A | 4/1998 |
| KR | 100274992 B1 | 9/2000 |
| KR | 100274993 B1 | 9/2000 |

OTHER PUBLICATIONS

International Search Report and Written Opinion for International Application No. PCT/IB2020/058613; dated Dec. 31, 2020; 10 pgs.

\* cited by examiner

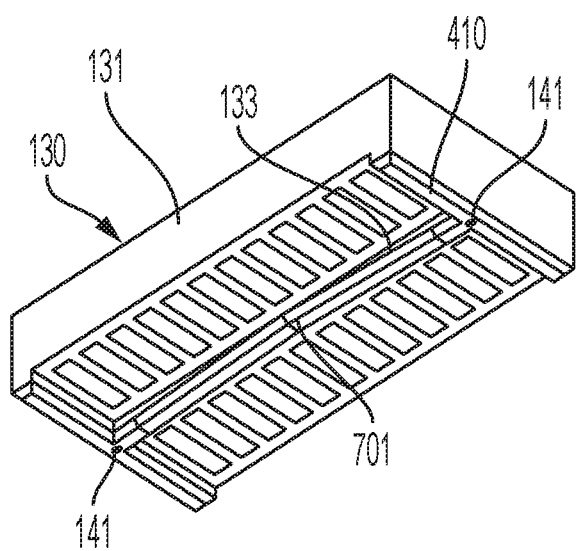
FIG. 7
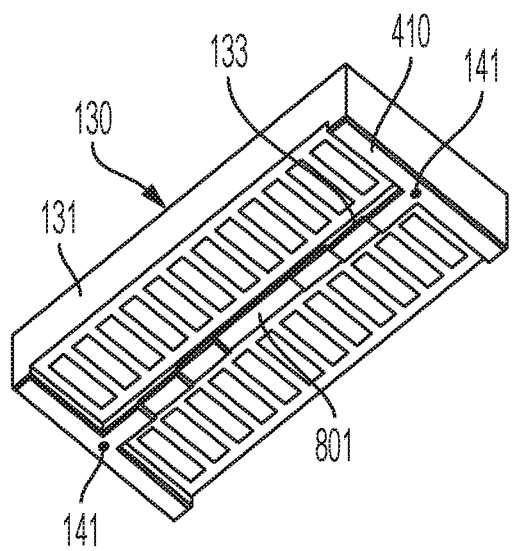
FIG. 8
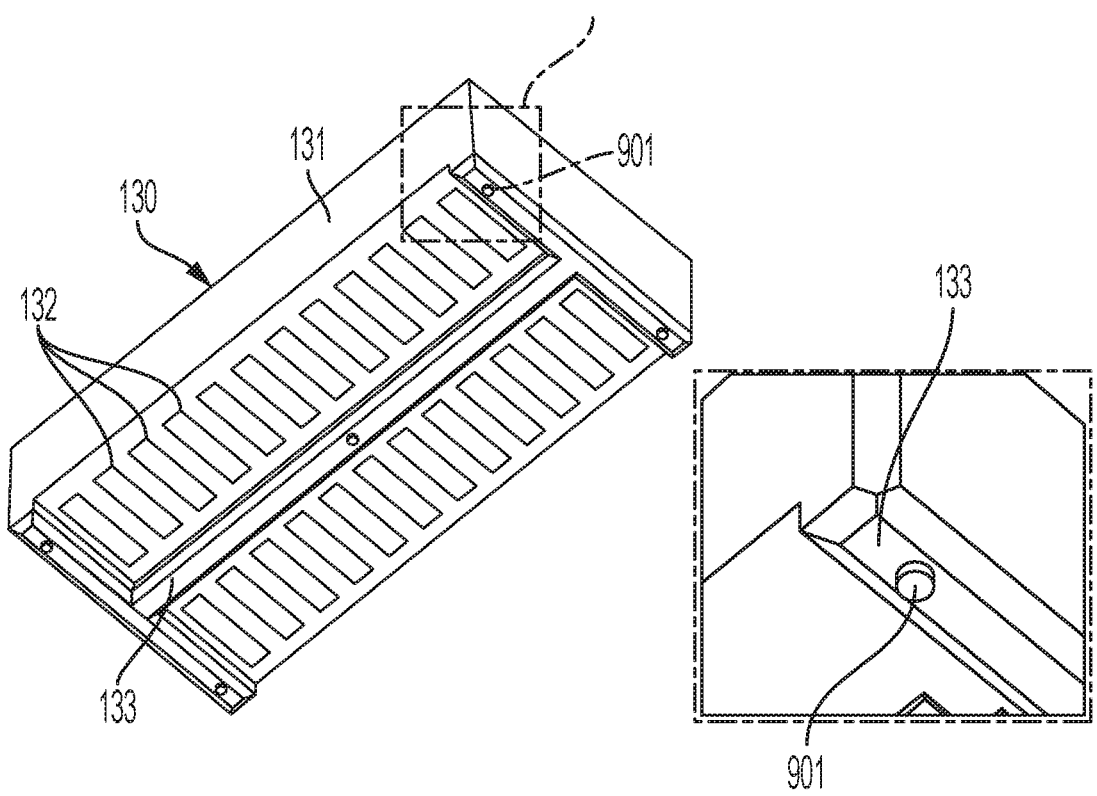
FIG. 9
FIG. 10

STRUCTURE WITH CONTROLLED CAPILLARY COVERAGE

BACKGROUND

The present invention generally relates to surface-mounted electrical components, and more specifically, to a surface-mounted electrical component structure with controlled capillary coverage.

Surface-mounted electrical components are typically mechanically affixed to printed circuit boards (PCBs) using pins that are inserted into through-holes defined through the PCBs. The surface-mounted electrical components can include a housing and the pins can be part of this housing or can be pressed into the housing after the housing is molded. The pins are often attached to the board using an adhesive or solder.

SUMMARY

Embodiments of the present invention are directed to a structure with controlled capillary coverage. The structure includes a substrate including one or more first contacts, a component and adhesive. The component includes one or more second contacts and a rib disposed at a distance from each of the one or more second contacts. The component is disposed such that the one or more second contacts are communicative with the one or more first contacts and corresponding surfaces of the substrate and the rib face each other at a controlled gap height to define a fill-space. The adhesive is dispensed at a discrete point whereby the adhesive is drawn to fill the fill-space by capillary action.

According to additional or alternative embodiments of the present invention, the controlled gap height, fluidic characteristics of the adhesive and a configuration of the rib establish a pressure of the capillary action.

According to additional or alternative embodiments of the present invention, the rib includes one or more of a chamfer, a discontinuous section, a tapered section and a stepped section.

According to additional or alternative embodiments of the present invention, the rib includes hard-stop elements.

According to additional or alternative embodiments of the present invention, at least one of the rib includes anchor elements extending partially across the controlled gap height and the rib is formed to define open sections into which pillars of the adhesive are drawn by the capillary action.

According to additional or alternative embodiments of the present invention, the discrete point is in the fill-space and the adhesive is drawn to fill a remainder of the fill-space by the capillary action or the discrete point is adjacent to the fill-space and the adhesive is drawn to fill an entirety of the fill-space by the capillary action.

According to additional or alternative embodiments of the present invention, the adhesive is dispensed through a through-hole defined through the body of the component or the adhesive is dispensed through a through-hole defined through the substrate.

Embodiments of the present invention are directed to a structure with controlled capillary coverage. The structure includes a substrate including one or more first contacts, a component and one or more of capillary adhesive, glue, epoxy and underfill. The component includes one or more second contacts and a rib disposed at a distance from each of the one or more second contacts. The rib includes hard-stop elements and the component is disposed such that the one or more second contacts are communicative with the one or more first contacts and corresponding surfaces of the substrate and the rib face each other at a controlled gap height established by the hard-step elements to define a fill-space. The one or more of the capillary adhesive, the glue, the epoxy and the underfill is dispensed at a discrete point whereby the one or more of the capillary adhesive, the glue, the epoxy and the underfill is drawn to fill the fill-space by capillary action.

According to additional or alternative embodiments of the present invention, the controlled gap height, fluidic characteristics of the one or more of the capillary adhesive, the glue, the epoxy and the underfill and a configuration of the rib establish a pressure of the capillary action.

According to additional or alternative embodiments of the present invention, the rib includes one or more of a chamfer, a discontinuous section, a tapered section and a stepped section.

According to additional or alternative embodiments of the present invention, at least one of the rib includes anchor elements extending partially across the controlled gap height and the rib is formed to define open sections into which pillars of the one or more of the capillary adhesive, the glue, the epoxy and the underfill are drawn by the capillary action.

According to additional or alternative embodiments of the present invention, the discrete point is in the fill-space and the one or more of the capillary adhesive, the UF, the glue and the epoxy is drawn to fill a remainder of the fill-space by the capillary action or the discrete point is adjacent to the fill-space and the capillary adhesive, the glue, the epoxy and the underfill is drawn to fill an entirety of the fill-space by the capillary action.

According to additional or alternative embodiments of the present invention, the one or more of the capillary adhesive, the glue, the epoxy and the underfill is dispensed through a through-hole defined through the body of the component or the one or more of the capillary adhesive, the glue, the epoxy and the underfill is dispensed through a through-hole defined through the substrate.

Embodiments of the present invention are directed to a structure with controlled capillary coverage. The structure includes a substrate including one or more first contacts, first and second components and one or more of capillary adhesive, glue, epoxy and underfill. The first and second components each include one or more second contacts and a rib at a distance from each of the one or more second contacts. The first and second components are each disposed immediately adjacent to one another such that the respective one or more second contacts are communicative with respective portions of the one or more first contacts and respective corresponding surfaces of the substrate and the respective ribs face each other at controlled gap heights to define first and second fill-spaces. The one or more of the capillary adhesive, the glue, the epoxy and the underfill is dispensed at first and second discrete points whereby the one or more of the capillary adhesive, the glue, the epoxy and the underfill is drawn to fill the first and second fill-spaces, respectively, by capillary action.

Embodiments of the present invention are directed to a method of assembling a structure with controlled capillary coverage. The method includes disposing a component such that contacts thereof are positioned to communicate with contacts of a substrate and a rib of the component faces a surface of the substrate, soldering the contacts of the component to the contacts of the substrate such that the rib faces the surface at a controlled gap height to define a fill-space and dispensing one or more of capillary adhesive, glue, epoxy and underfill at a discrete point whereby the one or more of the capillary adhesive, the glue, the epoxy and the underfill is drawn to fill the fill-space by capillary action.

According to additional or alternative embodiments of the present invention, the method further includes setting the controlled gap height, selecting the one or more of the capillary adhesive, the glue, the epoxy and the underfill for fluidic characteristics and configuring the rib to establish a pressure of the capillary action.

According to additional or alternative embodiments of the present invention, the discrete point is in the fill-space and the one or more of the capillary adhesive, the glue, the epoxy and the underfill is drawn to fill a remainder of the fill-space by the capillary action or the discrete point is adjacent to the fill-space and the one or more of the capillary adhesive, the glue, the epoxy and the underfill is drawn to fill an entirety of the fill-space by the capillary action.

According to additional or alternative embodiments of the present invention, the dispensing of the one or more of the capillary adhesive, the glue, the epoxy and the underfill includes dispensing through a through-hole defined through the component or the dispensing of the one or more of the capillary adhesive, the glue, the epoxy and the underfill includes dispensing through a through-hole defined through the substrate.

Embodiments of the present invention are directed to a method of assembling a structure with controlled capillary coverage. The method includes disposing a component such that contacts thereof are positioned to communicate with contacts of a substrate and a rib of the component faces a surface of the substrate, soldering the contacts of the component to the contacts of the substrate, setting a hard-stop between the rib and the surface during the soldering such that the rib faces the surface at a controlled gap height established by the hard-stop to define a fill-space and dispensing one or more of capillary adhesive, glue, epoxy and underfill at a discrete point whereby the one or more of the capillary adhesive, the glue, the epoxy and the underfill is drawn to fill the fill-space by capillary action.

According to additional or alternative embodiments of the present invention, the method further includes setting the controlled gap height, selecting the one or more of the capillary adhesive, the glue, the epoxy and the underfill for fluidic characteristics and configuring the rib to establish a pressure of the capillary action.

According to additional or alternative embodiments of the present invention, the discrete point is in the fill-space and the one or more of the capillary adhesive, the glue, the epoxy and the underfill is drawn to fill a remainder of the fill-space by the capillary action or the discrete point is adjacent to the fill-space and the one or more of the capillary adhesive, the glue, the epoxy and the underfill is drawn to fill an entirety of the fill-space by the capillary action.

According to additional or alternative embodiments of the present invention, the dispensing of the one or more of the capillary adhesive, the glue, the epoxy and the underfill includes dispensing through a through-hole defined through the component or the dispensing of the one or more of the capillary adhesive, the glue, the epoxy and the underfill includes dispensing through a through-hole defined through the substrate.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 7 is a perspective view of a component, contacts and a rib in accordance with embodiments of the present invention;

FIG. 8 is a perspective view of a component, contacts and a rib in accordance with embodiments of the present invention;

FIG. 9 is a perspective view of a component, contacts, a rib and a hard-stop element in accordance with embodiments of the present invention;

FIG. 10 is an enlarged perspective view illustrating details of the highlighted portion of FIG. 9;

Figure 1A:
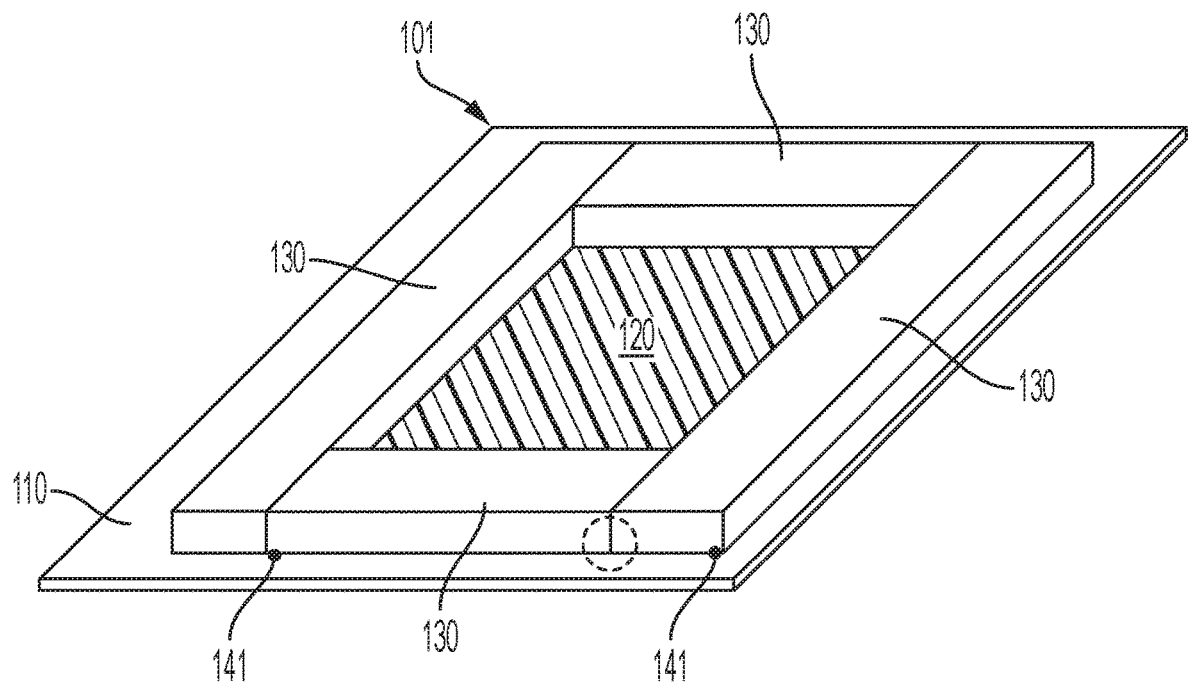
FIG. 1A is a perspective view of a structure with control capillary coverage in accordance with embodiments of the present invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the disclosed embodiments, the various elements illustrated in the figures are provided with two or three digit reference numbers. With minor exceptions, the leftmost digit(s) of each reference number correspond to the figure in which its element is first illustrated.

DETAILED DESCRIPTION

Processor packages typically include processor chip(s), discrete components and a lid mounted on a laminate where the bottom of the laminate often includes a ball grid array (BGA) or a land grid array (LGA). The BGA or the LGA provides for electrical connection and communication with a printed circuit board (PCB).

For both LGA and BGA applications, the laminate can further include an array of contacts covering nearly all of the bottom surface. These contacts are used to transmit and receive data and to supply power to the processor chip(s). Thus, any hole through the laminate correspondingly removes or decreases area that could otherwise be used for input/output (I/O) operations and/or power transfer and can be detrimental to an overall performance characteristic of the system. For this reason, pins that require through-holes holes are sometimes deemed to be less than desirable.

As an additional issue, for high-speed electronic components, a dielectric performance of the material between adjacent electrical leads is often critical to the overall performance characteristic of the system. While certain underfill (UF) materials are dielectric materials and do offer good dielectric performance, allowing for air to occupy the spaces between adjacent electrical leads is typically preferred for promoting a highest quality of signal integrity. As such, in order to fit as many components as possible into a surface-mounted electrical component without sacrificing performance, minimizing an area required for adhesive or UF is often desirable.

With the above in mind, it is to be understood that side-fill epoxies can be used to affix electrical components, but they require significant area outside the device footprint for the adhesive fillet.

Embodiments of the invention provide for a structure of an electronic device that is selectively underfilled. The structure includes features to encourage capillary underfill to flow only in certain areas to thereby mechanically attach a device to an underlying substrate without encapsulating an entire gap between the device and the substrate. The structure can be provided with a controlled gap height (smaller gap height results in higher capillary pressure), a specific local material (underfill or UF would preferentially flow under higher surface energy material) and locally roughened or activated surface features or mesh.

One or more embodiments of the present invention address one or more of the above-described shortcomings of the prior art by providing for a structure in which a need for solder pins is eliminated thus allowing for higher signal density in a given component footprint. In addition, since capillary adhesive can be dispensed after solder leads are joined, the component of the structure is allowed to self-center during reflow. Also, the capillary adhesive can flow underneath the component as opposed to being side-filled. This increases the area available for adhesive and a distance between adjacent components is reduced owing side-fill fillets being eliminated.

Figure 1B:
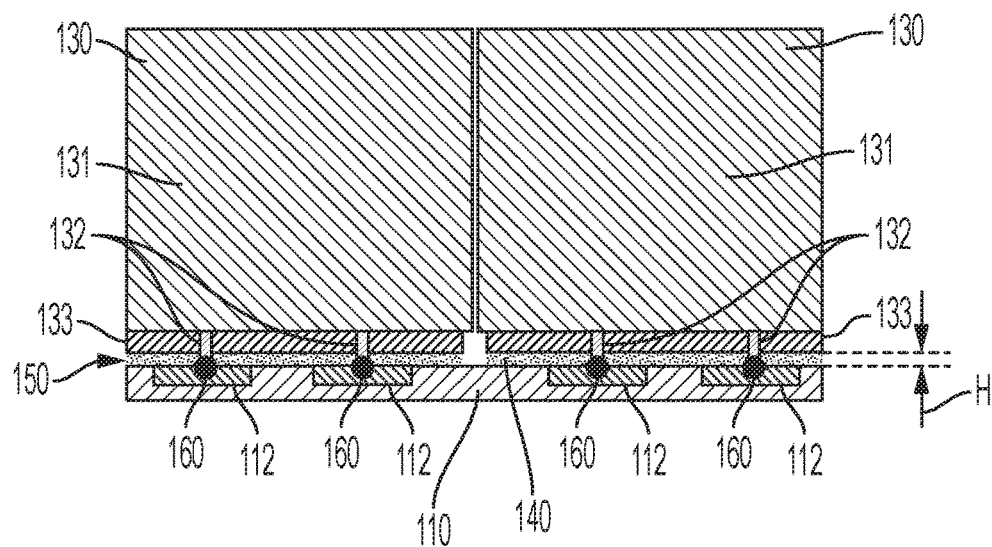
FIG. 1B is an enlarged side view illustrating details of the encircled portion of FIG. 1A.

Turning now to FIGS. 1A and 1B, a structure 101 is provided with controlled capillary coverage and includes a substrate 110, a central processing region 120, one or more components 130 and adhesive 140. The substrate 110 can be formed of a laminate. The substrate 110 includes one or more first contacts (hereinafter referred to as "first contacts") 112 that are arrayed along the substrate 110 in one or more groups. The one or more components 130 are disposed about the central processing region 120 and each component 130 includes a body 131, one or more second contacts (hereinafter referred to as "second contacts") 132 that are supported on the body 131 and a rib 133 at a distance D (see FIGS. 2 and 3) from each of the second contacts 132. The second contacts 132 can be provided as leads, electrical leads, balls (as in a ball grid array), solder balls, pads, etc. The rib 133 can be integrally connected or molded to the body 131, a feature that is built up onto the body 131, a feature that is formed from removal of material from the body 131 or a feature that is made of different materials than the body 131 and attached to the body 131.

As shown in FIGS. 1A and 1B, each component 130 is disposed proximate to the substrate 110 such that the second contacts 132 for each component 130 are communicative with a corresponding portion of the first contacts 112 and such that corresponding surface portions of the substrate 110 and the rib 133 of each component 130 face each other at a controlled gap height H to define a fill-space 150 (see FIG. 1B). The adhesive 140 can be provided as one or more of capillary adhesive, glue, low-viscosity epoxy and underfill and can be dispensed at one or more discrete points 141 (see FIG. 1A) for each component 130 whereby the adhesive 140 (hereinafter referred to as "capillary adhesive 140") is drawn by capillary action to fill the fill-space 150. Once the capillary adhesive 140 is cured, the capillary adhesive 140 mechanically attaches each of the components 130 to the substrate 110.

It is to be understood that while each component 130 is illustrated as a leaded component, other embodiments exist. For example, each component 130 could be provided as a stepped silicon die or as a non-leaded electrical component. For purposes of clarity and brevity, however, the following description will relate to the case of each component being provided as the leaded component.

With the capillary adhesive 140 drawn by the capillary action to fill the fill-space 150 for each component 130, a final location of the capillary adhesive 140 corresponds to the location of the rib 133. Since the rib 133 is disposed at the distance D from each of the second contacts 132 (and the first contacts 112 as well, since the respective arrangements of the first contacts 112 and the second contacts 132 correspond), the capillary adhesive 140 is maintained at a distance from the second contacts 132 and the first contacts 112. In these or other cases, air is provided around the second contacts 132 and the first contacts 112. A resulting dielectric performance of the structure 101 is improved.

It is to be understood that the controlled gap height H, fluidic characteristics of the capillary adhesive 140 and a configuration of the rib 133 for each component 130 can be determined, established and/or set cooperatively in order to establish a pressure of the capillary action that drives the flow of the capillary adhesive 140. For example, with the capillary adhesive 140 unchanged, a reduction in the controlled gap height H will result in an increase in capillary pressure increases and allows for a greater or increased length of the fill-space 150.

The structure 101 can further include solder 160 (see FIG. 1B) by which each of the second contacts 132 is electrically communicative with a corresponding one of the first contacts 112. Reflow of the solder 160 can be executed prior to the dispensing of the capillary adhesive 140 such that each component 130 is effectively self-centered during the solder reflow processing.

In accordance with embodiments of the present invention, the components 130 can be positioned immediately adjacent to one another in the structure 101 (see FIG. 1B). This is due to the fact that the components 130 are mechanically attached to the substrate 110 by the capillary adhesive 140 and not by side-filled adhesive that forms side-filled fillets or other similar features. In the absence of such such-filled fillets, the components 130 can be immediately adjacent to one another to thereby preserve surface area of the substrate 110 for use by other operational or functional elements.

Figure 2:
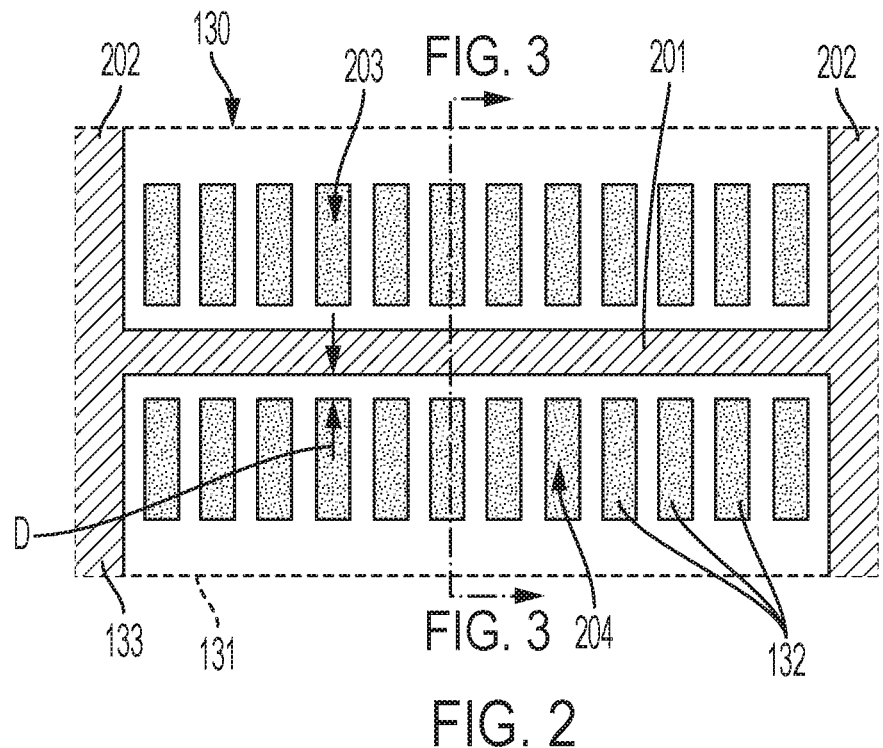
FIG. 2 is a schematic illustrating of contacts and a rib of a component of the structure of FIG. 1A in accordance with embodiments of the present invention.
Figure 3:
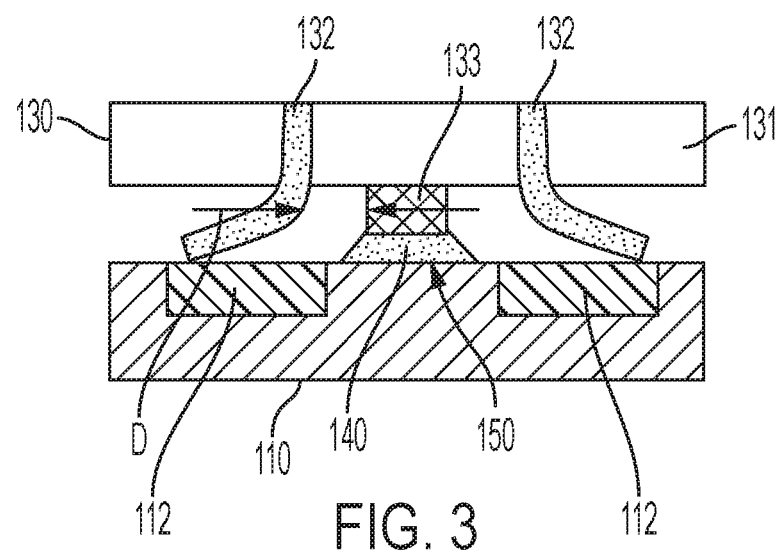
FIG. 3 is a cross-sectional view of the details of FIG. 2 taken along line 3-3 of FIG. 2.

With reference to FIGS. 2 and 3, embodiments of a given component 130 of the present invention are illustrated. As shown in FIG. 2, the component 130 has an H-shaped configuration in which the rib 133 has a central member 201 and opposed end members 202 and second contacts 132 that are arrayed in linear formations 203 and 204 on either side of the central member 201 between the opposed end members 202 (as noted above, it is expected that the first contacts 112 would have similar arrangements). As shown in FIG. 3, the second contacts 132 extend through and are supported by the body 131 to make contact with corresponding ones of the first contacts 112 on either side of the rib 133. The capillary adhesive 140 occupies the fill-space 150 between the rib 133 and the substrate 110 but does not come into contact with the second contacts 132 or the first contacts 112.

Figure 4:
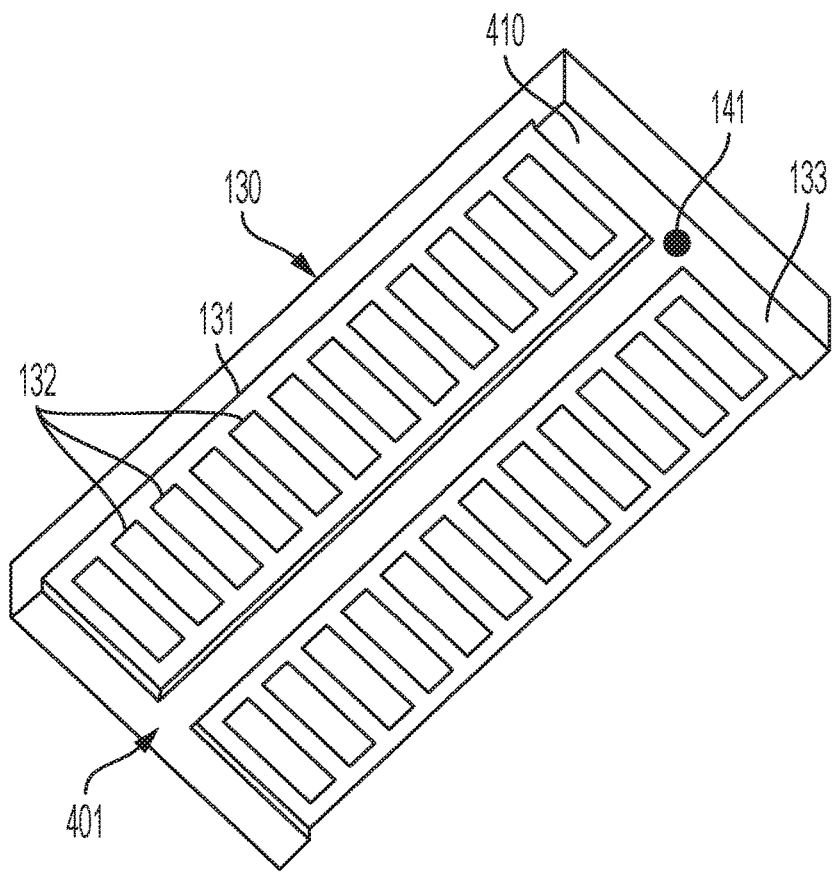
FIG. 4 is a perspective view of a component, contacts and a rib in accordance with embodiments of the present invention.

With reference to FIGS. 4-8 and in accordance with embodiments of the present invention, the rib 133 of each component 130 can have one or more of multiple rectangular, circular and irregular geometric shapes and can include one or more of a chamfer, a discontinuous section, a tapered section and a stepped section. For example, as shown in FIG. 4 (and FIG. 2), the rib 133 of the component 130 can have an H-shaped configuration 401. Though not shown, in accordance with alternative embodiments, the rib 133 can have a plus-shaped configuration, a rounded or angular S-shaped configuration, a ladder-shaped configuration, a short H-shaped configuration (in which contacts are provided between and outside of the opposed end members), a U-shaped configuration, a U-shaped configuration with inwardly extending extensions, a bisected configuration in which a member extends from a longitudinal member to bisect the contact formations, an enclosed configuration in which the contacts are fully or partially enclosed within one or more cavities defined by the rib and annular or circular configurations in which the contacts are arrayed circumferentially about radial members.

The following descriptions of the rib 133 of a given component 130 will relate to the case of the rib 133 having the H-shaped configuration 401 of FIG. 4. This is being done for purposes of clarity and brevity and it is to be understood that the descriptions apply to any configuration of the rib 133.

Figure 5:
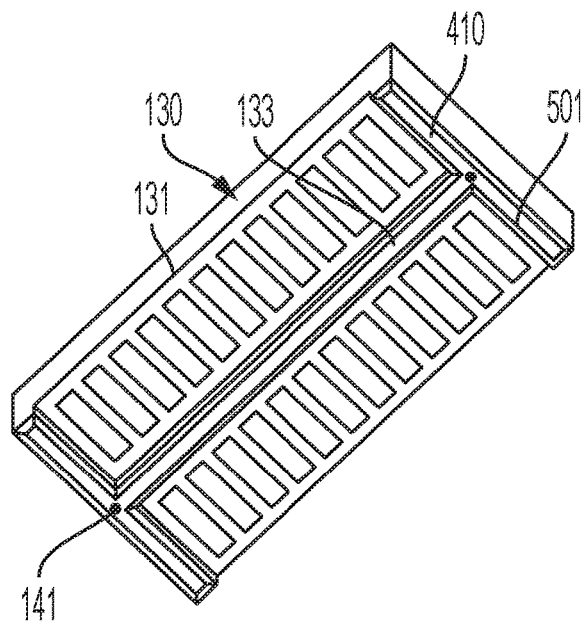
FIG. 5 is a perspective view of a component, contacts and a rib in accordance with embodiments of the present invention.
Figure 6:
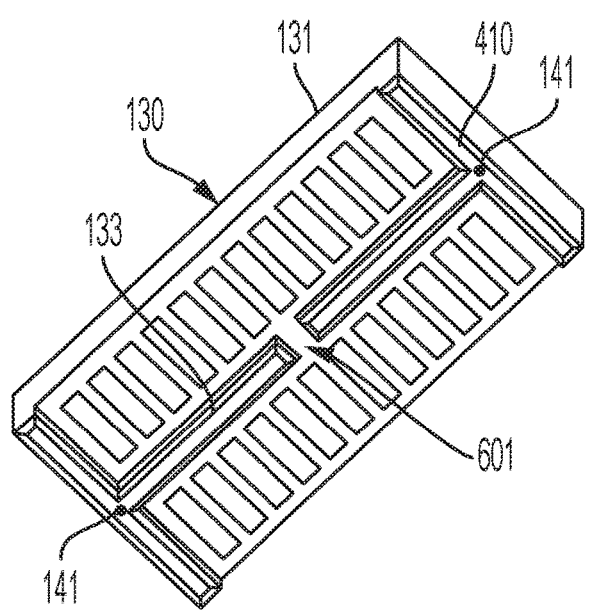
FIG. 6 is a perspective view of a component, contacts and a rib in accordance with embodiments of the present invention.

As shown in FIG. 4, the lower surface 410 of the rib 133 is substantially flat and planarized. By contrast, as shown in FIG. 5, the lower surface 410 of the rib 133 has a chamfer 501. As shown in FIG. 6, the chamfered lower surface 410 of the rib 133 is discontinuous and forms a break 601 whereas the chamfered lower surfaces 410 of the rib 133 in FIGS. 7 and 8 are provided with a taper 701 (see FIG. 7) and a stepped structure 801 (see FIG. 8). In each case, the structure of the rib 133 is a significant factor in the generation of capillary pressure and the ability of the capillary adhesive 140 to fill the corresponding fill-space 150. In particular, it is noted that the chamfer 501 of FIG. 5 reduces the surface area contacted by the capillary adhesive 140 and allows a given quantity of the capillary adhesive 140 to extend further along a length of the fill-space 150. On the other hand, the break 601, the taper 701 and the stepped structure of FIGS. 6, 7 and 8 each tend to reduce or stop the ability of the capillary adhesive 140 to continue to flow by the capillary action and, in these or other cases, two or more discrete points 141 can be required to obtain full capillary coverage.

With reference to FIGS. 9 and 10 and in accordance with embodiments of the present invention, the rib 133 for a given component 130 can include hard-stop elements 901. The hard-stop elements 901 each have a hard-stop height that establishes a lower limit for the controlled gap height H of the corresponding fill-space 150. That is, while the component 130 can be disposed at an initial height above the substrate 110 at an initiation of solder reflow processing to connect the second contacts 132 with the first contacts 112 and can migrate downwardly toward the substrate 110 as the solder reflow processing continues, the hard-stop elements 901 can eventually come into contact with the substrate 110 to prevent further migration of the component 130. It is to be understood that the hard-stop height of each of the hard-stop elements 901 would be set at or near a height whereby a pressure of the capillary action is sufficient to cause a selected capillary adhesive 140 to flow through an entirety of the fill-space 150.

Figure 11:
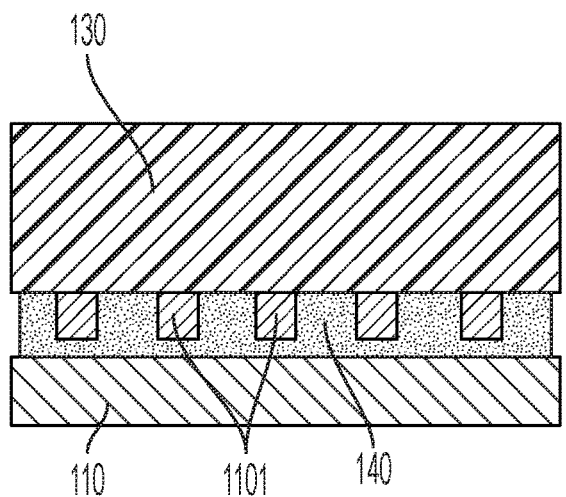
FIG. 11 is a side schematic view of anchor elements around which capillary adhesive is flown by capillary action in accordance with embodiments of the present invention.
Figure 12:
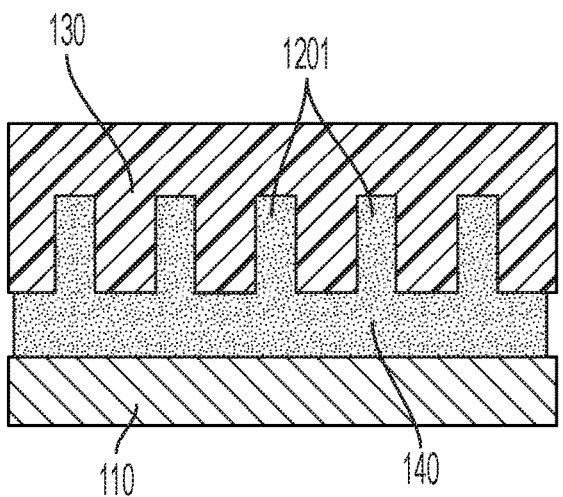
FIG. 12 is a side schematic view of empty spaces into which capillary adhesive is flown as capillary adhesive pillars by capillary action in accordance with embodiments of the present invention.

With reference to FIGS. 11 and 12, the rib 133 of a given component 130 can include anchor elements 1101 extending partially across the controlled gap height H (see FIG. 11) and/or the rib 133 of a given component 130 can be formed to define open sections 1201 into which pillars of the capillary adhesive 140 are drawn by the capillary action (see FIG. 12). In these or other cases, the anchor elements 1101 and the open section 1201 serve to promote and facilitate specified flow patterns of the capillary adhesive 140.

With reference back to FIG. 1 and FIGS. 4-8, the discrete point(s) 141 for a given component 130 can be defined in the fill-space 150 or adjacent to the fill-space 150. In the former case, as shown in FIGS. 4-8, the capillary adhesive 140 is drawn from the discrete point(s) 141 to fill a remainder of the fill-space 150 by the capillary action. In the latter case, as shown in FIG. 1, the capillary adhesive 140 is drawn to fill an entirety of the fill-space 150 by the capillary action.

Figure 13:
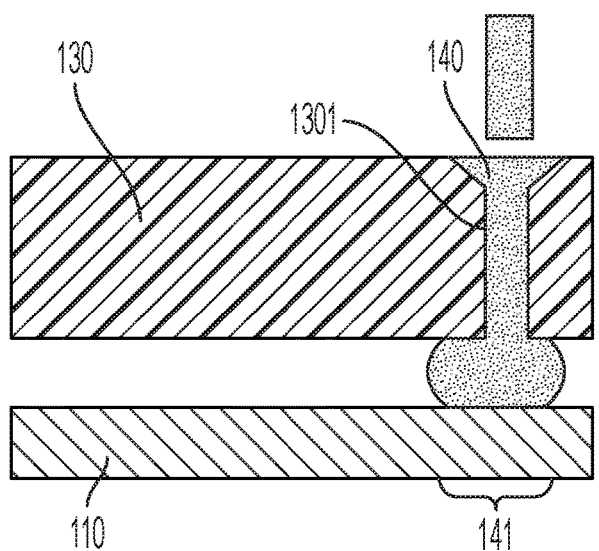
FIG. 13 is a side schematic view of capillary adhesive being dispensed through a component in accordance with embodiments of the present invention.
Figure 14:
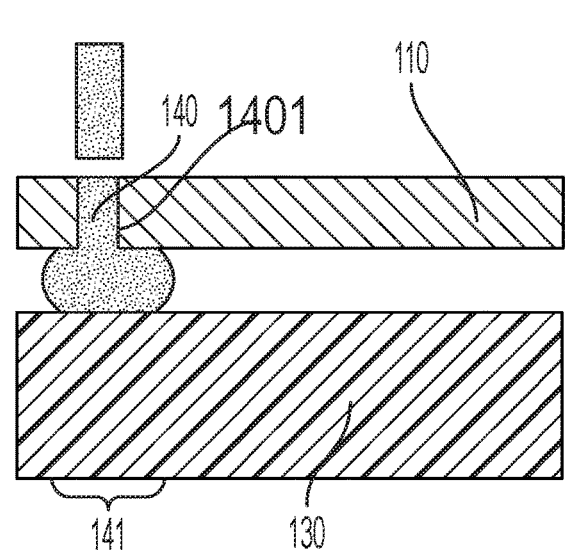
FIG. 14 is a side schematic view of capillary adhesive being dispensed through a substrate in accordance with embodiments of the present invention.

With reference to FIGS. 13 and 14, the capillary adhesive 140 can be dispensed through the component 130 or the substrate 110. That is, as shown in FIG. 13, the capillary adhesive 140 can be dispensed through a through-hole 1301 that is defined through the body 131 of the component 130 and toward the substrate 110. Alternatively, as shown in FIG. 14, the capillary adhesive 140 can be dispensed through a through-hole 1401 that is defined through the substrate 110 and toward the component 130. In these or other cases, the discrete point(s) 141 can be, but are not required to be, defined in the fill-space 150.

Figure 15:
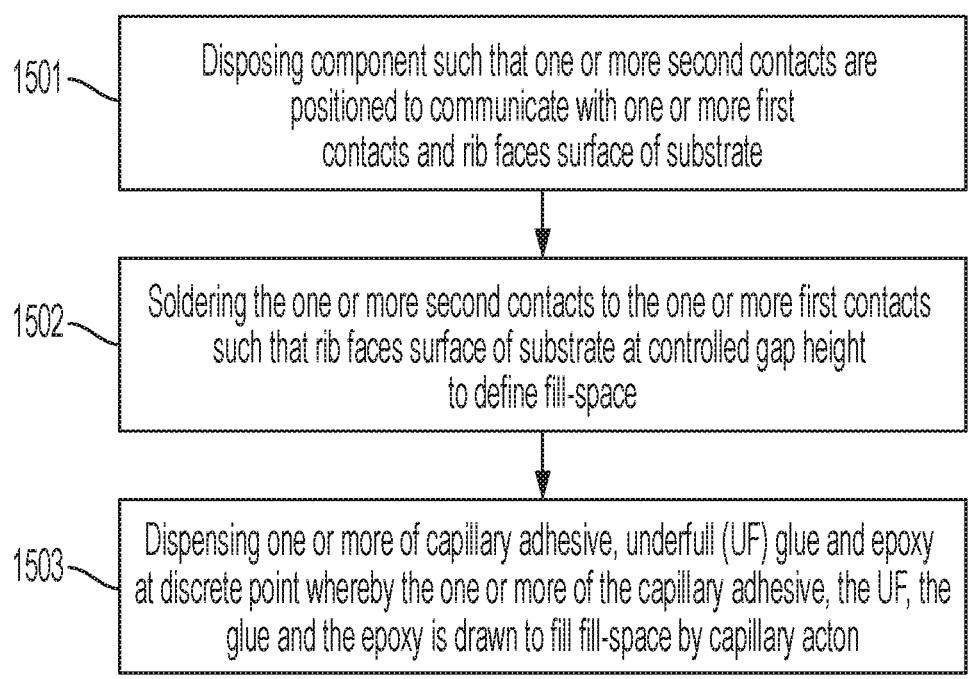
FIG. 15 is a flow diagram illustrating a method of assembling a structure with controlled capillary coverage in accordance with embodiments of the present invention.

With reference to FIG. 15, a method of assembling the structure 101 with controlled capillary coverage is provided. As shown in FIG. 15, the method includes disposing the component 130 such that the second contacts 132 are positioned to be communicative with the first contacts 112 and the rib 133 faces a surface of the substrate 110 (1501). The method further includes soldering the second contacts 132 to the first contacts 112 such that the rib 133 faces the surface of the substrate 110 at the controlled gap height H to define the fill-space 150 (1502) and dispensing capillary adhesive 140 at a discrete point 141 whereby the capillary adhesive 140 is drawn to fill the fill-space 150 by capillary action (1503). The method can further include setting a hard-stop between the rib 133 and the surface of the substrate 110 during the soldering of operation 1502 such that the rib 133 faces the surface of the substrate 110 at the controlled gap height H, which is effectively established by the hard-stop to define the fill-space 150.

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

One or more of the methods described herein can be implemented with any or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

In some embodiments, various functions or acts can take place at a given location and/or in connection with the operation of one or more apparatuses or systems. In some embodiments, a portion of a given function or act can be performed at a first device or location, and the remainder of the function or act can be performed at one or more additional devices or locations.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The present disclosure has been presented for purposes of illustration and description, but is not intended to be exhaustive or limited to the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

The diagrams depicted herein are illustrative. There can be many variations to the diagram or the steps (or operations) described therein without departing from the spirit of the disclosure. For instance, the actions can be performed in a differing order or actions can be added, deleted or modified. Also, the term "coupled" describes having a signal path between two elements and does not imply a direct connection between the elements with no intervening elements/connections therebetween. All of these variations are considered a part of the present disclosure.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A structure with controlled capillary coverage and comprising:
    a substrate comprising one or more first contacts;
    a component comprising one or more second contacts and a rib disposed at a distance from each of the one or more second contacts, the component being disposed such that the one or more second contacts are communicative with the one or more first contacts and corresponding surfaces of the substrate and the rib face each other at a controlled gap height to define a fill-space; and adhesive dispensed at a discrete point whereby the adhesive is drawn to fill the fill-space by capillary action, wherein the rib comprises hard-stop elements.

2. The structure according to claim 1, wherein the adhesive comprises one or more of capillary adhesive, glue, epoxy and underfill.

3. The structure according to claim 1, further comprising solder by which each of the one or more second contacts is electrically communicative with a corresponding one of the one or more first contacts.

4. The structure according to claim 1, wherein the controlled gap height, fluidic characteristics of the adhesive and a configuration of the rib establish a pressure of the capillary action.

5. The structure according to claim 1, wherein the rib comprises one or more of a chamfer, a discontinuous section, a tapered section and a stepped section.

6. The structure according to claim 1, wherein at least one of:
the rib comprises anchor elements extending partially across the controlled gap height, and
the rib defines open sections into which pillars of the adhesive are drawn by the capillary action.

7. The structure according to claim 1, wherein:
the discrete point is in the fill-space and the adhesive is drawn to fill a remainder of the fill-space by the capillary action, or
the discrete point is adjacent to the fill-space and the adhesive is drawn to fill an entirety of the fill-space by the capillary action.

8. The structure according to claim 1, wherein the adhesive is dispensed through a through-hole defined through the component or the adhesive is dispensed through a through-hole defined through the substrate.

9. A structure with controlled capillary coverage and comprising:
a substrate comprising one or more first contacts;
a component comprising one or more second contacts and a rib disposed at a distance from each of the one or more second contacts, the rib comprising hard-stop elements and the component being disposed such that the one or more second contacts are communicative with the one or more first contacts and corresponding surfaces of the substrate and the rib face each other at a controlled gap height established by the hard-step elements to define a fill-space; and
one or more of capillary adhesive, glue, epoxy and underfill dispensed at a discrete point whereby the one or more of the capillary adhesive, the glue, the epoxy and the underfill is drawn to fill the fill-space by capillary action.

10. The structure according to claim 9, further comprising solder by which each of the one or more second contacts is electrically communicative with a corresponding one of the one or more first contacts.

11. The structure according to claim 9, wherein the controlled gap height, fluidic characteristics of the one or more of the capillary adhesive, the glue, the epoxy and the underfill and a configuration of the rib establish a pressure of the capillary action.

12. The structure according to claim 9, wherein the rib comprises one or more of a chamfer, a discontinuous section, a tapered section and a stepped section.

13. The structure according to claim 9, wherein at least one of:
the rib comprises anchor elements extending partially across the controlled gap height, and
the rib defines open sections into which pillars of the one or more of the capillary adhesive, the glue, the epoxy and the underfill are drawn by the capillary action.

14. The structure according to claim 9, wherein:
the discrete point is in the fill-space and the one or more of the capillary adhesive, the glue, the epoxy and the underfill is drawn to fill a remainder of the fill-space by the capillary action, or
the discrete point is adjacent to the fill-space and the one or more of the capillary adhesive, the glue, the epoxy and the underfill is drawn to fill an entirety of the fill-space by the capillary action.

15. The structure according to claim 9, wherein:
the one or more of the capillary adhesive, the glue, the epoxy and the underfill is dispensed through a through-hole defined through the component, or
the one or more of the capillary adhesive, the glue, the epoxy and the underfill is dispensed through a through-hole defined through the substrate.

16. A structure with controlled capillary coverage and comprising:
a substrate comprising one or more first contacts;
first and second components each comprising one or more second contacts and a rib comprising hard-stop elements disposed at a distance from each of the one or more second contacts, the first and second components each being disposed immediately adjacent to one another such that:
the respective one or more second contacts are communicative with respective portions of the one or more first contacts, and
respective corresponding surfaces of the substrate and the respective ribs face each other at controlled gap heights defined by the hard-step elements to define first and second fill-spaces; and
one or more of capillary adhesive, glue, epoxy and underfill dispensed at first and second discrete points whereby the one or more of the capillary adhesive, the glue, the epoxy and the underfill is drawn to fill the first and second fill-spaces, respectively, by capillary action.

17. A method of assembling a structure with controlled capillary coverage, the method comprising:
disposing a component such that one or more contacts thereof are positioned to communicate with one or more contacts of a substrate and a rib of the component, which comprises hard-stop elements, faces a surface of the substrate;
soldering the one or more contacts of the component to the one or more contacts of the substrate such that the rib faces the surface at a controlled gap height defined by the hard-stop elements to define a fill-space; and
dispensing one or more of capillary adhesive, glue, epoxy and underfill at a discrete point whereby the one or more of the capillary adhesive, the glue, the epoxy and the underfill is drawn to fill the fill-space by capillary action.

18. The method according to claim 17, further comprising setting the controlled gap height, selecting the one or more of the capillary adhesive, the glue, the epoxy and the underfill for fluidic characteristics and configuring the rib to establish a pressure of the capillary action.

19. The method according to claim 17, wherein:
the discrete point is in the fill-space and the one or more of the capillary adhesive, the glue, the epoxy and the underfill is drawn to fill a remainder of the fill-space by the capillary action, or the discrete point is adjacent to the fill-space and the one or more of the capillary adhesive, the glue, the epoxy and the underfill is drawn to fill an entirety of the fill-space by the capillary action.

20. The method according to claim 17, wherein:
the dispensing of the one or more of the capillary adhesive, the glue, the epoxy and the underfill comprises dispensing through a through-hole defined through the component, or
the dispensing of the one or more of the capillary adhesive, the glue, the epoxy and the underfill comprises dispensing through a through-hole defined through the substrate.

21. A method of assembling a structure with controlled capillary coverage, the method comprising:
disposing a component such that one or more contacts thereof are positioned to communicate with one or more contacts of a substrate and a rib of the component faces a surface of the substrate;
soldering the one or more contacts of the component to the one or more contacts of the substrate;
setting a hard-stop between the rib and the surface during the soldering such that the rib faces the surface at a controlled gap height established by the hard-stop to define a fill-space; and
dispensing one or more of capillary adhesive, glue, epoxy and underfill at a discrete point whereby the one or more of the capillary adhesive, the glue, the epoxy and the underfill is drawn to fill the fill-space by capillary action.

22. The method according to claim 21, further comprising setting the controlled gap height, selecting the one or more of the capillary adhesive, the glue, the epoxy and the underfill for fluidic characteristics and configuring the rib to establish a pressure of the capillary action.

23. The method according to claim 21, wherein:
the discrete point is in the fill-space and the one or more of the capillary adhesive, the glue, the epoxy and the underfill is drawn to fill a remainder of the fill-space by the capillary action, or
the discrete point is adjacent to the fill-space and the one or more of the capillary adhesive, the glue, the epoxy and the underfill is drawn to fill an entirety of the fill-space by the capillary action.

24. The method according to claim 21, wherein:
the dispensing of the one or more of the capillary adhesive, the glue, the epoxy and the underfill comprises dispensing through a through-hole defined through the component, or
the dispensing of the one or more of the capillary adhesive, the glue, the epoxy and the underfill comprises dispensing through a through-hole defined through the substrate.

* * * * *